US009966256B2

(12) United States Patent
Takagi et al.

(10) Patent No.: US 9,966,256 B2
(45) Date of Patent: May 8, 2018

(54) FILM FORMING METHOD AND FILM FORMING APPARATUS

(71) Applicant: TOKYO ELECTRON LIMITED, Tokyo (JP)

(72) Inventors: Satoshi Takagi, Nirasaki (JP); Kazuya Takahashi, Nirasaki (JP); Hiroki Murakami, Nirasaki (JP); Daisuke Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 19 days.

(21) Appl. No.: 14/844,193

(22) Filed: Sep. 3, 2015

(65) Prior Publication Data
US 2016/0071728 A1 Mar. 10, 2016

(30) Foreign Application Priority Data

Sep. 5, 2014 (JP) ................. 2014-181416

(51) Int. Cl.
| C23C 16/00 | (2006.01) |
| H01L 21/02 | (2006.01) |
| C23C 16/455 | (2006.01) |
| C23C 16/44 | (2006.01) |
| C23C 16/52 | (2006.01) |

(Continued)

(52) U.S. Cl.
CPC .... H01L 21/02532 (2013.01); C23C 16/4412 (2013.01); C23C 16/45578 (2013.01); C23C 16/52 (2013.01); C30B 1/023 (2013.01); C30B 1/026 (2013.01); C30B 1/04 (2013.01); C30B 29/06 (2013.01); C30B 29/08 (2013.01); C30B 29/52 (2013.01); H01L 21/0262 (2013.01);
(Continued)

(58) Field of Classification Search
CPC .......... C23C 16/4412; C23C 16/45578; C23C 16/52
See application file for complete search history.

(56) References Cited

U.S. PATENT DOCUMENTS

| 2005/0064686 A1* | 3/2005 | Chidambarrao .. H01L 21/26506 438/518 |
| 2011/0312192 A1* | 12/2011 | Murakami ........ C23C 16/45523 438/787 |
| 2012/0156835 A1* | 6/2012 | Isa .................... H01L 29/78696 438/158 |

FOREIGN PATENT DOCUMENTS

| JP | 8-227994 A | 9/1996 |
| JP | 2004-349374 A | 12/2004 |

(Continued)

OTHER PUBLICATIONS

Sriraman et al. Mechanism of hydrogen-induced crystallization of amorphous silicon, Jul. 2002, Nature, 418, pp. 62-65.*

(Continued)

*Primary Examiner* — Kelly M Gambetta
(74) *Attorney, Agent, or Firm* — Nath, Goldberg & Meyer; Jerald L. Meyer

(57) ABSTRACT

There is provided a method of forming a film on a surface to be processed of a workpiece, the method including: accommodating the workpiece with a single-crystallized substance formed on the surface to be processed, into a processing chamber; supplying a crystallization suppressing process gas into the processing chamber such that a crystallization of the single-crystallized substance formed on the surface to be processed is suppressed; and supplying a source gas into the processing chamber to form an amorphous film on the surface to be processed of the workpiece.

11 Claims, 9 Drawing Sheets

(51) Int. Cl.
  *C30B 1/02* (2006.01)
  *C30B 1/04* (2006.01)
  *C30B 29/06* (2006.01)
  *C30B 29/08* (2006.01)
  *C30B 29/52* (2006.01)

(52) U.S. Cl.
  CPC .. *H01L 21/02592* (2013.01); *H01L 21/02667* (2013.01); *H01L 21/02669* (2013.01)

(56) References Cited

FOREIGN PATENT DOCUMENTS

| | | |
|---|---|---|
| JP | 2004-356164 A | 12/2004 |
| JP | 2006-210697 A | 8/2006 |
| JP | 2006-210698 A | 8/2006 |
| JP | 2009-231836 A | 10/2009 |
| JP | 5023004 B2 | 6/2012 |
| JP | 2013-162028 A | 8/2013 |

OTHER PUBLICATIONS

Iyer et al. Low-temperature silicon cleaning via hydrogen passivation and conditions for epitaxy, Appl. Phys. Lett. 57, 893 (1990) pp. 893-895.*

Meyerson, Bernard S. UHV/CVD Growth of Si and Si:Ge Alloys: Chemistry, Physics, and Device Applications, Proceedings of the IEEE vol. 80, No. 10 (1992) pp. 1592-1608.*

\* cited by examiner

Reference example

Reference example

Reference example

Reference example

FILM FORMING METHOD AND FILM FORMING APPARATUS

CROSS-REFERENCE TO RELATED APPLICATION

This application claims the benefit of Japanese Patent Application No. 2014-181416, filed on Sep. 5, 2014, in the Japan Patent Office, the disclosure of which is incorporated herein in its entirety by reference.

TECHNICAL FIELD

The present disclosure relates to a method of forming a silicon film, a germanium film or a silicon-germanium film, and a film forming apparatus thereof.

BACKGROUND

As method of forming a new semiconductor layer on a semiconductor substrate, an epitaxial growth method has been widely used in a semiconductor manufacturing process. For example, the epitaxial growth method is sometimes used in forming a new silicon (Si) single crystalline layer (Si epitaxial layer) on a single-crystallized Si substrate.

For example, there is known a method which includes forming an amorphous Si layer on a single-crystallized Si substrate, by performing a thermal treatment on the formed amorphous Si layer and performing a solid-phase epitaxial growth using an exposed surface of the single-crystallized Si as a seed.

In addition to Si, a silicon-germanium (SiGe) or a germanium (Ge) is getting a lot of attention as a semiconductor material as SiGe or Ge can further improve performance of a semiconductor integrated circuit device. In other words, SiGe and Ge materials have higher carrier mobility than Si. As such, the use of the SiGe or Ge material further increases an operating speed of a transistor.

For example, there is known a method of growing a SiGe epitaxial layer on a single-crystallized Si substrate.

However, as a homo-epitaxial growth, for example, when a Si epitaxial layer is grown on the single-crystallized Si substrate, "pyramid-like sharp portions" (also referred to as "facets") are generated on a surface of the Si epitaxial layer. In addition, as a hetero-epitaxial growth, for example, when a SiGe epitaxial layer is grown on a single-crystallized Si substrate, a "roughness" (also referred to as a "cross hatch pattern") is generated on a surface of the SiGe epitaxial layer due to a difference between lattice constants of Si and SiGe.

In addition, an amorphous film is hard to grow on an underlying single-crystallized substrate. This is because the amorphous film deposited on the underlying single crystallized substrate drags a lattice constant of the underlying single-crystallized substrate.

SUMMARY

Some embodiments of the present disclosure provide a film forming method which is capable of suppressing irregularities from being generated on a surface of a crystallized Si film, a crystallized Ge or a crystallized SiGe film due to facets or a cross hatch pattern, even when the crystallized Si film, the crystallized Ge film or the crystallized SiGe film is grown on a single-crystallized Si, a single-crystallized Ge or single-crystallized SiGe substrate, and a film forming apparatus adapted to perform the film forming method.

Further, some embodiments of the present disclosure provide a film forming method which is capable of forming an amorphous Si, an amorphous Ge or an amorphous SiGe film on a single-crystallized Si, a single-crystallized Ge or a single-crystallized SiGe film, respectively, and a film forming apparatus adapted to perform the film forming method.

According to one embodiment of the present disclosure, there is provided a method of forming a film on a surface to be processed of a workpiece, the method including: accommodating the workpiece with a single-crystallized substance formed on the surface to be processed, into a processing chamber; supplying a crystallization suppressing process gas into the processing chamber such that a crystallization of the single-crystallized substance formed on the surface to be processed is suppressed; and supplying a source gas into the processing chamber to form an amorphous film on the surface to be processed of the workpiece.

According to another embodiment of the present disclosure, there is provided a method of forming a film on a surface of a single-crystallized substance, the method including: changing a lattice constant of the surface of the single-crystallized substance; and forming an amorphous film on the surface of the single-crystallized substance.

According to yet another embodiment of the present disclosure, there is provided an apparatus of forming a silicon film on a surface to be processed of a workpiece, including: a processing chamber configured to accommodate the workpiece therein; a gas supply mechanism configured to supply a crystallization suppressing process gas, a silicon-containing gas and an inert gas into the processing chamber; a heating device configured to heat an interior of the processing chamber; an exhaust device configured to exhaust the interior of the processing chamber; and a controller configured to control the gas supply mechanism, the heating device and the exhaust device such that the method of claim 1 is performed on the workpiece accommodated in the processing chamber.

According to still another embodiment of the present disclosure, there is provided an apparatus of forming a germanium film on a surface to be processed of a workpiece, including: a processing chamber configured to accommodate the workpiece therein; a gas supply mechanism configured to supply a crystallization suppressing process gas, a germanium-containing gas and an inert gas into the processing chamber; a heating device configured to heat an interior of the processing chamber; an exhaust device configured to exhaust the interior of the processing chamber; and a controller configured to control the gas supply mechanism, the heating device and the exhaust device such that the method of claim 1 is performed on the workpiece accommodated in the processing chamber.

According to still another embodiment of the present disclosure, there is provided an apparatus of forming a silicon-germanium film on a surface to be processed of a workpiece, including: a processing chamber configured to accommodate the workpiece therein; a gas supply mechanism configured to supply a crystallization suppressing process gas, a silicon-containing gas, a germanium-containing gas and an inert gas into the processing chamber; a heating device configured to heat an interior of the processing chamber; an exhaust device configured to exhaust the interior of the processing chamber; and a controller configured to control the gas supply mechanism, the heating device and the exhaust device such that the method of claim 1 is performed on the workpiece accommodated in the processing chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
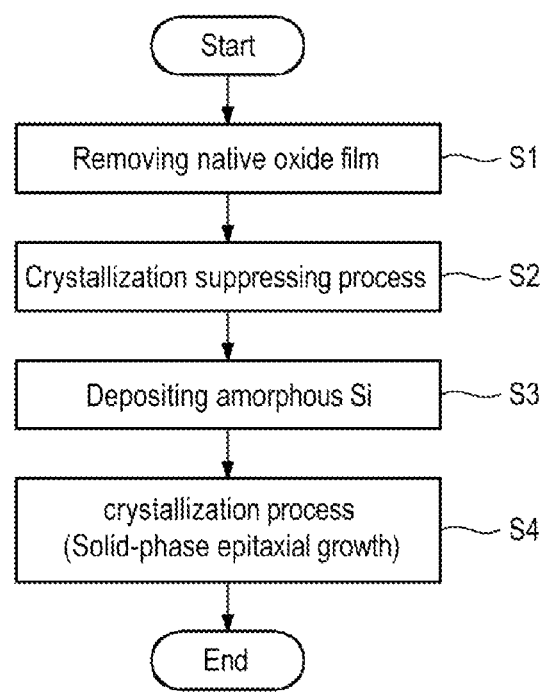
FIG. 1 is a flowchart showing an example of a silicon film forming method according to a first embodiment of the present disclosure.

Hereinafter, embodiments of the present disclosure will be described with reference to the accompanying drawings. Throughout the drawings, like reference numerals denote the same or similar elements or functionality. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

<Film Forming Method>

A first embodiment of the present disclosure mainly relates to a homo-epitaxial growth.

FIG. 1 is a flowchart showing an example of a silicon film forming method according to the first embodiment of the present disclosure. FIGS. 2A to 2E are cross-sectional views schematically showing states of a workpiece during a sequence shown in FIG. 1.

Figure 2A:
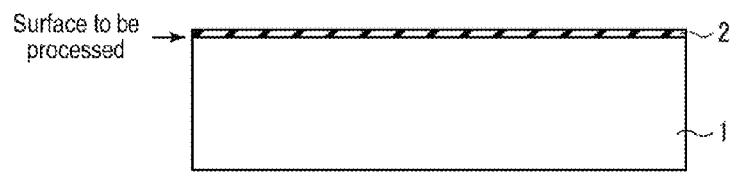
FIGS. 2A to 2E are cross-sectional views schematically showing states of a workpiece during a sequence shown in FIG. 1.

First, as shown in FIG. 2A, for example, a silicon wafer (hereinafter, simply referred to as a "wafer") 1 is prepared as the workpiece. The wafer 1 is a single-crystallized Si. A thin native oxide film 2 is formed on a surface to be processed of the single-crystallized Si. While in this embodiment, the native oxide film 2 is formed on the surface to be processed of the single-crystallized Si, a chemical oxide film may be formed on the surface to be processed of the single-crystallized Si by undergoing a chemical reaction with an ambient other than atmosphere.

Figure 2B:
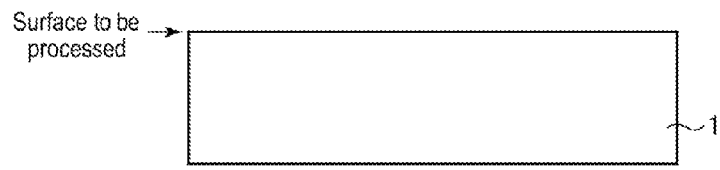

Subsequently, as shown in step S1 of FIG. 1 and FIG. 2B, the native oxide film 2 is removed from the surface to be processed of the wafer 1. Examples of the removal technique of the native oxide film 2 may include a wet cleaning (also referred to as a wet etching) using a hydrogen-containing substance (e.g., a dilute hydrofluoric acid (DHF)) adapted to remove the native oxide film 2 and a chemical oxide removal (COR) process using both an ammonia ($NH_3$) gas and a hydrofluoric acid (HF) gas. Thus, the single-crystallized Si is exposed from the surface to be processed of the wafer 1.

Figure 2C:

Subsequently, as shown in step S2 of FIG. 1 and FIG. 2C, a crystallization suppressing process is performed on a surface of the single-crystallized Si which is exposed from the surface to be processed of the wafer 1. The "crystallization suppressing" used herein refers to suppressing crystallization of an amorphous Si film which is subsequently formed. In this embodiment, the crystallization suppressing process is a gas-based chemical process. In this embodiment, a hydrogen-containing gas, e.g., a phosphine ($PH_3$) gas is used in the crystallization suppressing process. The $PH_3$ gas is supplied into, for example, a processing chamber (in which the wafer 1 is accommodated) of a film forming apparatus, which will be described later.

The inventors of the present disclosure have found that, when a crystallized Si is grown on a single-crystallized substance (e.g., the single-crystallized Si substrate), "facets" are generated on a surface of the crystallized Si, which are caused by a very small amount of oxygen atoms remaining on the surface to be processed of the single-crystallized Si.

Figure 3A:
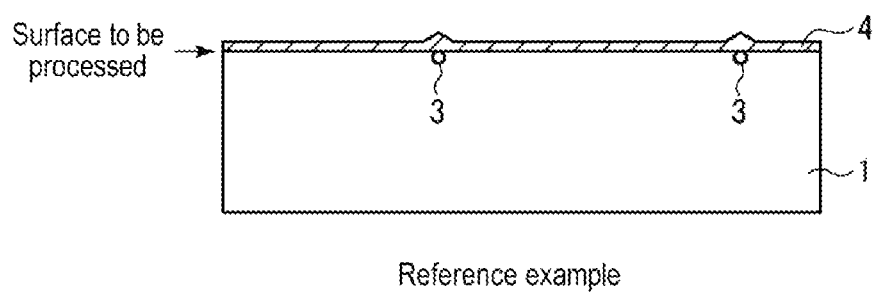
FIGS. 3A and 3B are cross-sectional views of a reference example.
Figure 3B:
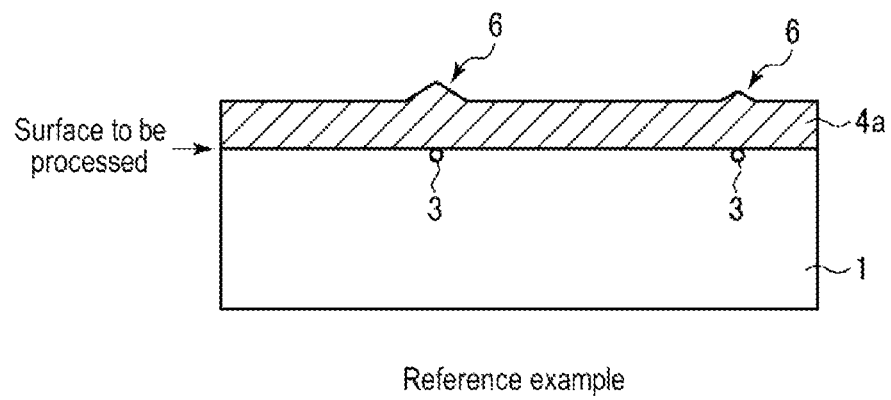

FIGS. 3A and 3B are cross-sectional views of a reference example.

A thin $SiO_2$ film such as the native oxide film 2 can be removed by the wet cleaning or the COR process in step S1. However, for example, as shown in FIG. 3A, a very small amount of oxygen atoms 3 may be coupled with dangling bonds of Si atoms present in the uppermost portion of the surface to be processed. The coupled oxygen atoms 3 remain on the surface to be processed. Subsequently, an amorphous Si is deposited on the surface to be processed where the oxygen atoms 3 locally remain such that an amorphous Si film 4 is formed. In this case, a deposition rate of the amorphous Si film 4 at portions where the oxygen atoms 3 remain differs from that at another portion where no oxygen atoms remain.

As a result, as shown in FIG. 3B, pyramid-like facets 6 are generated on a surface of a crystallized Si film 4a.

In order to suppress the generation of the pyramid-like facets 6, according to the first embodiment of the present disclosure, the thin $SiO_2$ film such as the native oxide film 2 is removed by the wet cleaning or the COR process, and subsequently, the remaining oxygen atoms are removed.

Figure 4A:
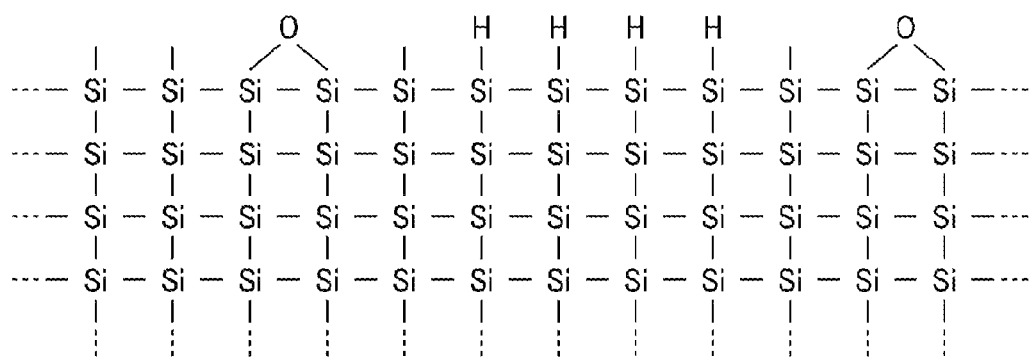
FIGS. 4A to 4C are views schematically showing a structure of a single-crystallized Si.
Figure 4B:
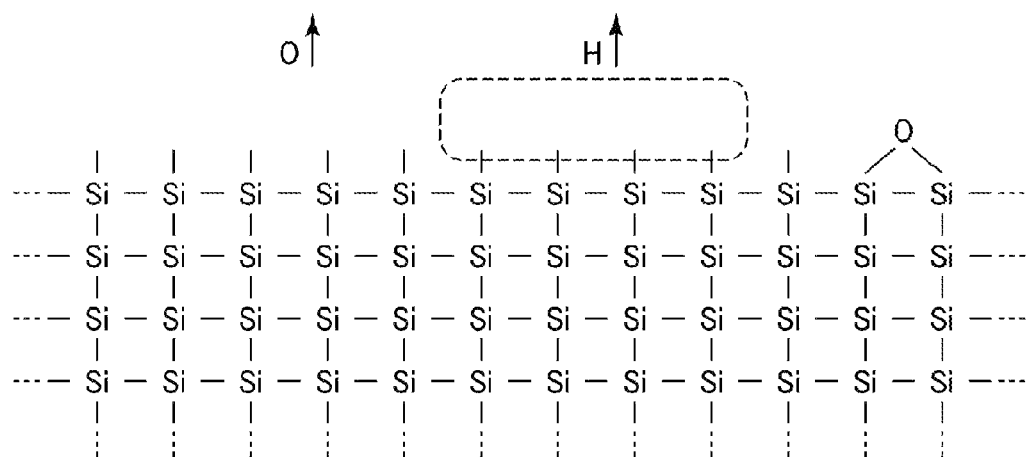
Figure 4C:
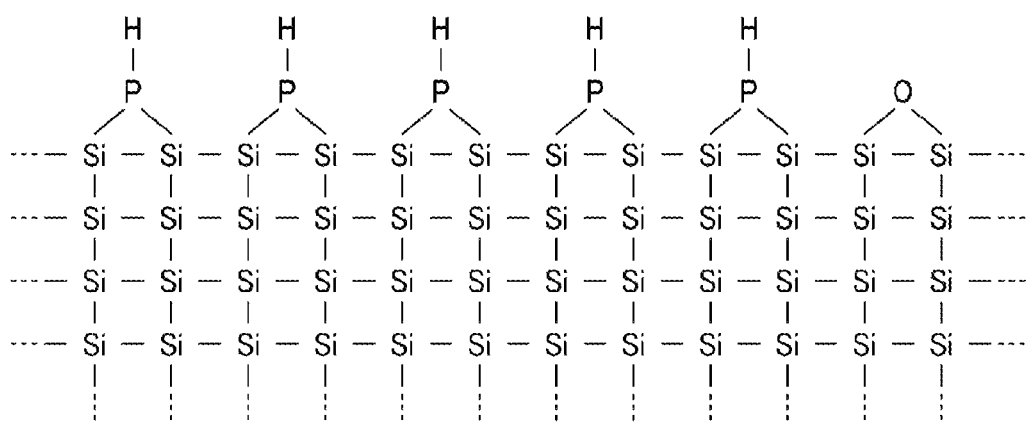

FIGS. 4A to 4C are views schematically showing a structure of the single-crystallized Si.

As shown in FIG. 4A, in the structure of the single-crystallized Si, Si atoms are regularly arranged in such a manner that four bonds of one Si atom are coupled with another four Si atoms, respectively. However, each of the Si atoms arranged in the uppermost portion (the surface to be processed) of the single-crystallized Si has one dangling bond. In general, an "oxygen atom (O)", or a "hydrogen atom (H)" contained in a solution or gas used in the wet cleaning or the COR process is coupled with the dangling bond, while any dangling bonds may be remained without coupling with an O or H atom.

To address this, as shown in FIG. 4B, the coupled O or H atom is separated from the surface to be processed as far as possible. Subsequently, as shown in FIG. 4C, substances adapted to be adsorbed to the plurality of Si atoms are coupled with the dangling bonds of the Si atoms. A substance adapted to couple with the plurality of Si atoms in a "covalent bonding" or "intermolecular bonding" fashion may be used as an adsorption mode. In FIG. 4C, for example, substances "PH" are coupled with the dangling bonds of the Si atoms.

As described above, in the crystallization suppressing process of step S2 of FIG. 1, the substances adapted to be adsorbed to the plurality of Si atoms are coupled with the dangling bonds of the Si atoms. This process changes a lattice constant of the wafer 1, which makes it possible to suppress a subsequent amorphous Si film from being locally crystallized.

An example of process conditions applied in Step S2 is as follows:

Flow rate of $PH_3$: 100 to 1,000 sccm
Process time: 1 to 60 minutes
Process temperature: 300 to 800 degrees C.
Process pressure: 133.3 to 53320 Pa (1 to 400 Torr)
(wherein 1 Torr is defined as 133.3 Pa)

While in this embodiment, the $PH_3$ gas, i.e., a phosphine-based gas ($PH_3$, $P_2H_4$, etc.) is used as a gas for the crystallization suppressing process, other gas such as a borane-based gas, a hydrocarbon-based gas or an organosilane-based gas may be used as the crystallization suppressing process gas. That is to say, any gas containing phosphorus (P), boron (B) and carbon (C) or the like may be used as the crystallization suppressing process gas.

Figure 2D:
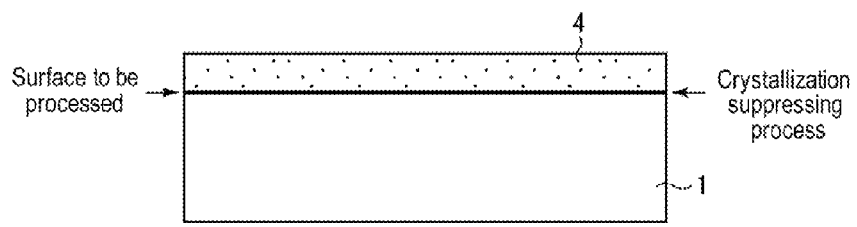

Subsequently, as shown in step S3 of FIG. 1 and FIG. 2D, an amorphous Si is deposited on the surface to be processed of the wafer 1 which has been subjected to the crystallization suppressing process, thereby forming the amorphous Si film 4. The amorphous Si film 4 is formed by supplying, e.g., a silicon source gas, into the processing chamber (in which the wafer 1 is accommodated) of the film forming apparatus. In this embodiment, a hydrogen-containing gas, e.g., a disilane $Si_2H_6$ gas, is used as the silicon source gas.

An example of process conditions applied in Step S3 is as follows:

Flow rate of $Si_2H_6$: 10 to 1,000 sccm
Process time: 1 minute or more
Process temperature: 350 to 450 degrees C.
Process pressure: 13.3 to 1333.3 Pa (0.1 Torr to 10 Torr)

In this embodiment, the $Si_2H_6$ gas is used as the silicon source gas, but is not limited thereto. In some embodiments, a hydrogen-silicon-containing gas may be used as a source gas for forming the amorphous Si film 4.

Figure 2E:
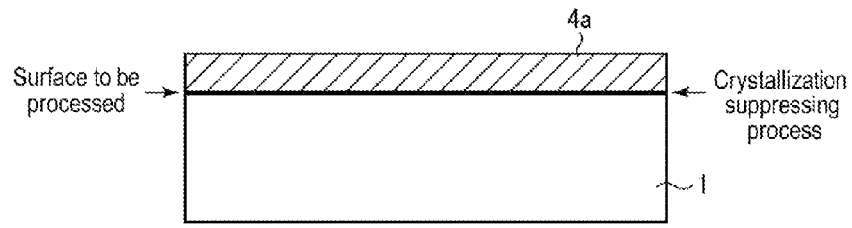

Subsequently, as shown in step S4 of FIG. 1 and FIG. 2E, a solid-phase epitaxial growth process is performed with respect to the wafer 1 on which the amorphous Si film 4 is formed. The solid-phase epitaxial growth process corresponds to, e.g., a thermal treatment which is performed in an inert gas atmosphere. An example of the inert gas may include a nitrogen gas. The solid-phase epitaxial process modifies the amorphous Si film 4 into a crystallized Si film 4a. The crystallized Si film 4a is, for example, a single crystal.

An example of process conditions applied in Step S4 in the inert gas atmosphere is as follows:

Process time: 60 minutes
Process temperature: 300 to 1000 degrees C.
Process pressure: 133.3 to 101,308 Pa (1 to 760 Torr)

Although in this embodiment, the solid-phase epitaxial growth process has been described to be performed in the inert gas atmosphere, the present disclosure is not limited thereto. In some embodiments, the solid-phase epitaxial growth process may be performed in a hydrogen gas atmosphere or a state in which an interior of the processing chamber of the film forming apparatus is vacuumed.

As described above, according to the silicon film forming method of the first embodiment of the present disclosure, the crystallization suppressing process is performed on the surface to be processed of the single-crystallized Si, and subsequently, the amorphous Si film 4 is formed on the surface to be processed of the single-crystallized Si. Thus, it is possible to suppress irregularities such as the facets from being generated on the surface to be processed when the amorphous Si film 4 is crystallized.

Further, in the first embodiment, the crystallized Si is formed on the single-crystallized Si, but is not limited thereto. In some embodiments, a crystallized Ge may be formed on a single-crystallized Ge. In some embodiments, a crystallized SiGe may be formed on a single-crystallized SiGe.

Second Embodiment

<Film Forming Method>

A second embodiment of the present disclosure mainly relates to a hetero-epitaxial growth.

Figure 5:
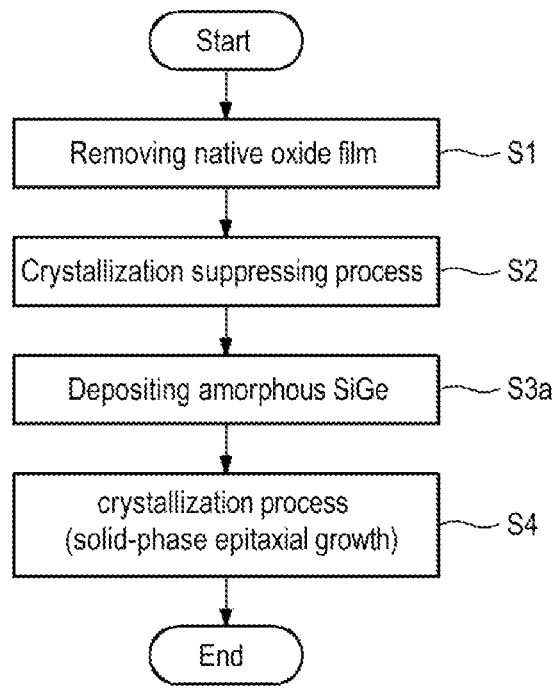
FIG. 5 is a flowchart showing an example of a silicon-germanium film forming method according to a second embodiment of the present disclosure.

FIG. 5 is a flowchart showing an example of a silicon-germanium film forming method according to the second embodiment of the present disclosure. FIGS. 6A to 6E are cross-sectional views schematically showing states of a workpiece during a sequence shown in FIG. 5.

As shown in FIGS. 5 and 6A to 6E, the second embodiment is similar to the first embodiment except that, in the second embodiment, a crystallized SiGe film 8a is formed on the single-crystallized Si, while in the first embodiment, the crystallized Si film 4a is formed on the single-crystallized Si.

First, as shown in steps S1 and S2 of FIG. 5 and FIGS. 6A to 6C, the crystallization suppressing process is performed on a surface of the single-crystallized Si which is exposed from the surface to be processed of the wafer 1, like the first embodiment.

Figure 6A:
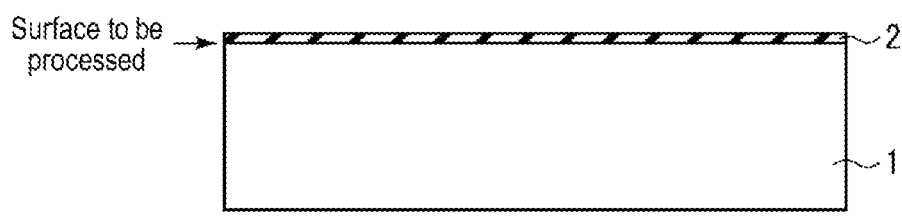
FIGS. 6A to 6E are cross-sectional views schematically showing states of a workpiece during a sequence shown in FIG. 5.
Figure 6B:
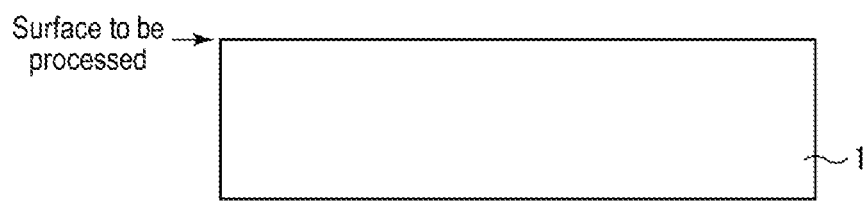
Figure 6C:
Figure 6D:
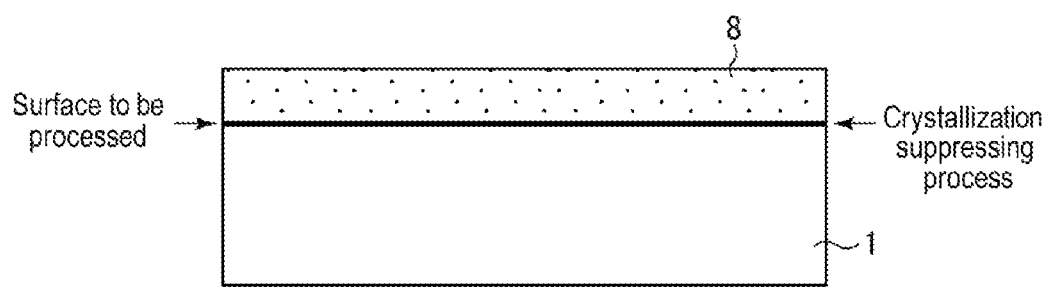

Subsequently, as shown in step S3a of FIG. 5 and FIG. 6D, an amorphous SiGe is deposited on the surface to be processed of the wafer 1 which has been subjected to the crystallization suppressing process such that an amorphous SiGe film 8 is formed. The amorphous SiGe film 8 is formed by, e.g., supplying a silicon-germanium source gas composed of a silicon-containing gas and a germanium-containing gas into the processing chamber (in which the wafer 1 is accommodated) of the film forming apparatus. In this embodiment, a hydrogen-silicon containing gas (e.g., mono silane ($SiH_4$)) and the germanium-containing gas (e.g., mono german ($GeH_4$)) are used as the silicon-germanium source gas.

An example of process conditions applied in Step S3a is as follows:

Flow rate of $SiH_4$: more than 0 to 5,000 sccm
Flow rate of $GeH_4$: more than 0 to 5,000 sccm
Process time: 5 minutes or more
Process temperature: 250 to 450 degrees C.
Process pressure: 13.33 to 533.2 Pa (0.1 to 4 Torr)

While in the second embodiment, the $SiH_4$ and $GeH_4$ gases has been described to be used as the silicon-germanium source gas, the present disclosure is not limited thereto. In some embodiments, other gas may be used as the source gas for forming the amorphous SiGe film 8 as long as it contains hydrogen, silicon and germanium.

Figure 6E:
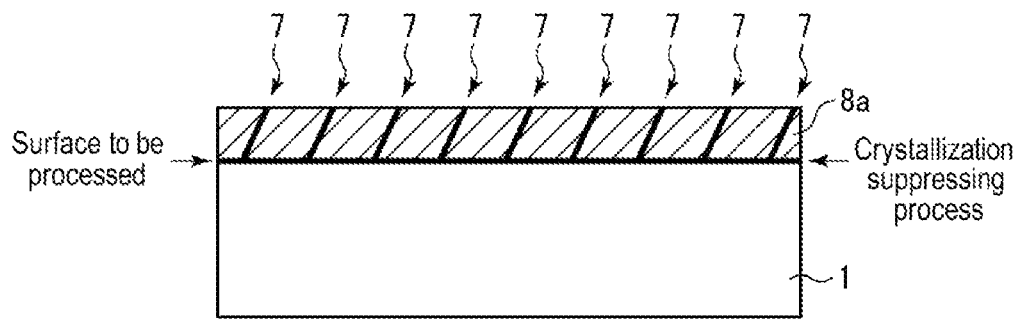

The second embodiment relates to the so-called hetero-epitaxial growth in which a crystallized SiGe film is formed on a single-crystallized Si. This hetero-epitaxial growth causes "misfit transitions" due to a crystal mismatch. In the second embodiment, a lattice constant of Si of the wafer 1 is different from that of the crystallized SiGe film 8a. As such, the misfit transitions 7 occur in the crystallized SiGe film 8a, as shown in FIG. 6E.

Figure 7A:
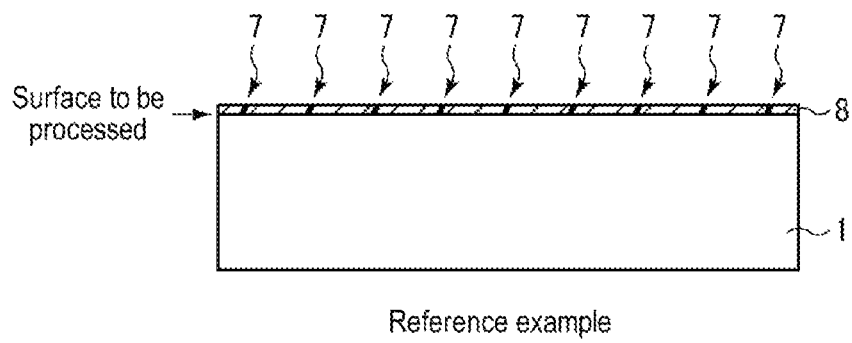
FIGS. 7A and 7B are cross-sectional views of a reference example.
Figure 7B:
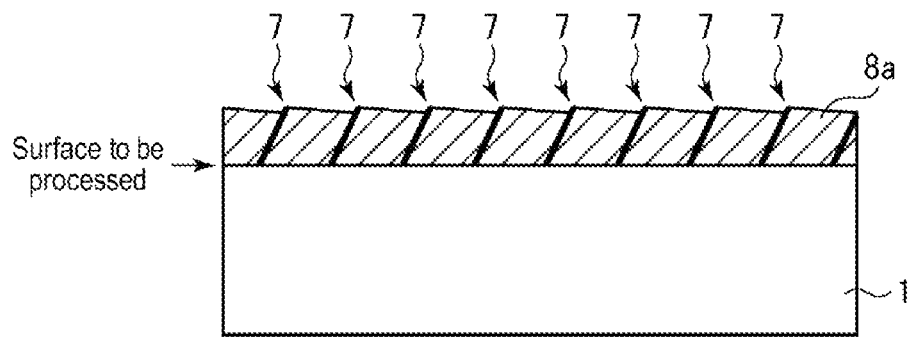

FIGS. 7A and 7B are cross-sectional views of a reference example.

For example, as shown in FIGS. 7A and 7B, assuming that the amorphous SiGe film 8 is formed on the single-crystallized Si which is exposed from the surface to be processed of the wafer 1. In this case, in the crystallized SiGe film 8a, the misfit transitions 7 occur in a regular pattern, for example. When the crystal growth progresses with the misfit transitions, "stepped portions caused by the misfit transitions 7 (i.e., a cross hatch pattern)" are generated on a surface of the crystallized SiGe film 8a.

In order to suppress the generation of "the stepped portions caused by the misfit transitions 7", it is necessary to change the lattice constant of the surface to be processed of the wafer 1 before forming the amorphous SiGe film 8, like the first embodiment. In the second embodiment, the lattice constant of the surface to be processed of the wafer 1 has been changed in step S2 of FIG. 5.

Subsequently, as shown in step S4 of FIG. 5 and FIG. 6E, a solid-phase epitaxial growth process is performed with respect to the wafer 1 on which the amorphous SiGe film 8 is formed, like the first embodiment. The solid-phase epitaxial growth process may be performed under the same conditions as the first embodiment, for example. The solid-phase epitaxial process modifies the amorphous SiGe film 8 into the crystallized SiGe film 8a.

According to the silicon-germanium film forming method according to the second embodiment of the present disclosure, the crystallization suppressing process is performed on the surface to be processed of the single-crystallized Si, and subsequently, the amorphous SiGe film 8 is formed on the single-crystallized Si. The misfit transitions 7 occur in the crystallized SiGe film 8a obtained by crystallizing the amorphous SiGe film 8. In this state, the solid-phase epitaxial growth process is performed. Thus, the misfit transitions 7 are generated to be restricted inside the amorphous SiGe film 8, compared to the case where the crystallization suppressing process is not performed. Accordingly, it is possible to suppress irregularities such as "the stepped portion caused by the misfit transitions 7" from being generated on the surface of the crystallized SiGe film 8a obtained by crystallizing the amorphous SiGe film 8.

In addition, while in the second embodiment, the crystallized SiGe has been described to be formed on the single-crystallized Si, the present disclosure is not limited thereto. In some embodiments, a crystallized Ge may be formed on the single-crystallized Si. Further, in some embodiments, a crystallized SiGe or a crystallized Si may be formed on a single-crystallized Ge. Alternatively, a crystallized Si or a crystallized Ge may be formed on a single-crystallized SiGe.

Third Embodiment

A third embodiment relates to a film forming apparatus which is capable of performing the film forming method according to the first and second embodiments of the present disclosure.

Figure 8:
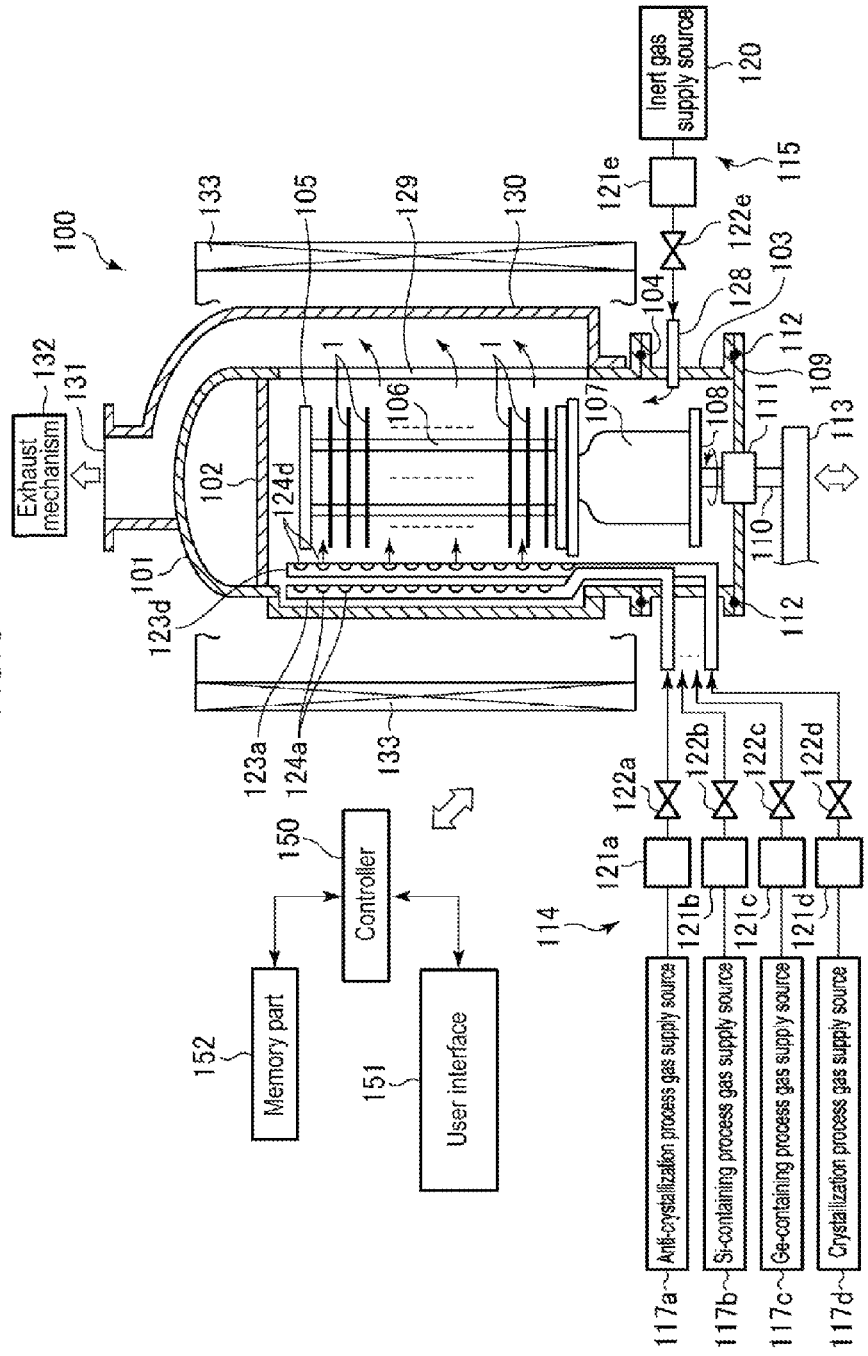
FIG. 8 is a cross-sectional view schematically showing an example of a film forming apparatus according to a third embodiment of the present disclosure.

FIG. 8 is a longitudinal cross-sectional view schematically showing an example of the film forming apparatus according to the third embodiment of the present disclosure.

As shown in FIG. 8, a film forming apparatus 100 includes a cylindrical processing chamber 101 having a ceiling with a bottom end opened. The entirety of the processing chamber 101 is formed of, e.g., quartz. A quartz ceiling plate 102 is located at the ceiling inside the processing chamber 101. Also, for example, a manifold 103, which is formed of a stainless steel to have a cylindrical shape, is connected to a lower end opening portion of the processing chamber 101 through a sealing member 104 such as an O-ring.

The manifold 103 supports a lower end portion of the processing chamber 101. A wafer boat 105 of quartz, in which a plurality of (e.g., 50 to 120) semiconductor wafers (the silicon wafers 1 in this embodiment) is loaded as workpieces in multiple stages, is insertable into the processing chamber 101 through a lower portion of the manifold 103. The wafer boat 105 includes a plurality of supporting pillars 106, and the plurality of wafers 1 are supported by grooves (not shown) which are formed in each of the supporting pillars 106.

The wafer boat 105 is loaded on a table 108 with a quartz heat insulating tube 107 interposed between the wafer boat 105 and the table 108. The table 108 is supported on a rotation shaft 110 that passes through a cover part 109. The cover part 109 is made of, e.g., a stainless steel, and opens or closes a lower end opening portion of the manifold 103. For example, a magnetic fluid seal 111 is disposed at a through portion of the rotation shaft 110. The magnetic fluid seal 111 closely seals and rotatably supports the rotation shaft 110. Also, for example, a seal member 112 such as an O-ring is disposed between a periphery of the cover part 109 and a lower end portion of the manifold 103, thus maintaining sealability in the processing chamber 101. The rotation shaft 110 is disposed at, e.g., a front end of an arm 113 that is supported by an ascending/descending instrument (not shown) such as a boat elevator. Accordingly, the wafer boat 105 and the cover part 109 are elevated in an integrated manner to be inserted into/separated from the processing chamber 101.

The film forming apparatus 100 includes a process gas supply mechanism 114 configured to supply process gases into the processing chamber 101 and an inert gas supply mechanism 115 configured to supply an inert gas into the processing chamber 101.

The process gas supply mechanism 114 includes a crystallization suppressing process gas supply source 117a, a Si-containing process gas supply source 117b, a Ge-containing process gas supply source 117c, and a crystallization process gas supply source 117d.

In this embodiment, the crystallization suppressing process gas supply source 117a supplies a $PH_3$ gas as the crystallization suppressing process gas into the processing chamber 101. The Si-containing process gas supply source 117b supplies a $Si_2H_6$ gas as the Si-containing process gas into the processing chamber 101. The Ge-containing process gas supply source 117c supplies a $GeH_4$ gas as the Ge-containing process gas into the processing chamber 101. The crystallization process gas supply source 117d supplies a $H_2$ gas as the crystallization process gas into the processing chamber 101.

The inert gas supply mechanism 115 includes an inert gas supply source 120. The inert gas supply source 120 supplies an $N_2$ gas as the inert gas into the processing chamber 101.

In some embodiments, when the film forming apparatus 100 is tailored to form a "silicon film", the Ge-containing process gas supply source 117c may be eliminated. Further, in some embodiments, when the film forming apparatus 100 is tailored to form a "germanium film", the Si-containing process gas supply source 117b may be eliminated. Further, in some embodiments, when the film forming apparatus 100 is configured to supply the inert gas (e.g., the $N_2$ gas) in the crystallization process, the crystallization process gas supply source 117d may be eliminated. In this case, the $N_2$ gas as the crystallization process gas is supplied from the inert gas supply source 120 into the processing chamber 101.

The crystallization suppressing process gas supply source 117a is coupled to a dispersion nozzle 123a through a flow rate controller 121a and an on-off valve 122a. Likewise, the Si-containing process gas supply source 117b is coupled to a dispersion nozzle 123b (not shown) through a flow rate controller 121b and an on-off valve 122b. Similarly, the Ge-containing process gas supply source 117c is coupled to a dispersion nozzle 123c (not shown) through a flow rate controller 121c and an on-off valve 122c. Similarly, the crystallization process gas supply source 117d is coupled to a dispersion nozzle 123d through a flow rate controller 121d and an on-off valve 122d.

Each of the dispersion nozzles 123a to 123d, which pierces through the sidewall of the manifold 103 inward, bends upward, and extends vertically, includes a quartz tube. At vertical portions of the dispersion nozzles 123a to 123d, a plurality of gas discharge holes 124a to 124d is formed spaced apart from each other by a predetermined distance, respectively. The crystallization suppressing process gas, the Si-containing process gas, the Ge-containing process gas and the crystallization process gas are approximately uniformly discharged from the respective gas discharge holes 124a to 124d into the processing chamber 101 in a horizontal direction.

The inert gas supply source 120 is coupled to a nozzle 128 through a flow rate controller 121e and an on-off valve 122e. The nozzle 128, which penetrates through the sidewall of the manifold 103, discharges the inert gas from a tip of the nozzle 128 into the processing chamber 101 in the horizontal direction.

At a portion opposite to the dispersion nozzles 123a to 123d in the processing chamber 101, an exhaust vent 129 is installed to exhaust an interior of the processing chamber 101. The exhaust vent 129 has an elongated shape formed by chipping the sidewall of the processing chamber 101 in the vertical direction. At a portion corresponding to the exhaust vent 129 of the processing chamber 101, an exhaust vent cover member 130 with a C-shaped section is installed by welding to cover the exhaust vent 129. The exhaust vent cover member 130 extends upward along the sidewall of the processing chamber 101, and defines a gas outlet 131 at the top of the processing chamber 101. An exhaust mechanism 132 including a vacuum pump is connected to the gas outlet 131. The exhaust mechanism 132 exhausts the interior of the processing chamber 101 to discharge the process gas used for the process and to change an internal pressure of the processing chamber 101 into a process pressure adapted for the process.

A cylindrical body-shaped heating device 133 is installed on an outer periphery of the processing chamber 101. The heating device 133 activates a gas supplied into the processing chamber 101, and heats a workpiece (e.g., the wafer 1 in this embodiment) loaded in the processing chamber 101.

For example, respective parts of the film forming apparatus 100 are controlled by a controller 150 including a microprocessor (computer). The controller 150 is connected to a user interface 151. The user interface 151 includes an input part equipped with a touch panel or a keyboard for inputting, by an operator, a command to control the film forming apparatus 100, a display for visually displaying an operation state of the film forming apparatus 100, or the like.

A memory part 152 is connected to the controller 150. The memory part 152 stores a control program for executing various processes in the film forming apparatus 100 under the control of the controller 150, and a program (i.e., a recipe) for executing respective processes in the respective components of the film forming apparatus 100 according to process conditions. The recipe is stored in, e.g., a memory medium of the memory part 152. The memory medium may include a hard disk, a semiconductor memory, or a portable memory such as a CD-ROM, a DVD, a flash memory or the like. The recipe may be suitably transmitted from other device through a dedicated line. If necessary, the recipe is read from the memory part 152 in response to a command received from the user interface 151, and the controller 150 executes a process according to the read recipe. Accordingly, the film forming apparatus 100 performs a desired process under the control of the controller 150.

In this embodiment, the film forming methods according to the first and second embodiments are performed under the control of the controller 150. The film forming methods according to the first and second embodiments can be performed by the film forming apparatus 100 shown in FIG. 8.

Although the present disclosure has been described according to the first and second embodiments, the present disclosure is not limited thereto. A variety of modifications may be made without departing from the spirit of the disclosures.

For example, while in the first and second embodiments, the crystallization suppressing process has been described to be performed on the surface to be processed of the wafer 1 (i.e., the single-crystallized Si which is originally formed as a single crystal), the same effects may be manifested even for a surface to be processed of a crystallized Si which is formed by crystallizing an amorphous Si using a solid-phase epitaxial growth process. That is to say, the first and second embodiments may be applied for either a workpiece made of an original single crystal or a workpiece crystallized (or single-crystallized) by a crystallization process.

In the first and second embodiments, the crystallization suppressing process has been described to be performed on the surface to be processed of the single crystal Si or the crystallized Si such that the crystallized Si film 4a or the crystallized SiGe film 8a is formed. In some embodiments, the crystallization suppressing process may be performed on a surface to be processed of a single-crystallized SiGe or a crystallized SiGe such that the crystallized Si film 4a or the crystallized SiGe film 8a may be formed. Further, in some embodiments, a crystallized Si film, a crystallized Ge film or a crystallized SiGe film may be formed on the surface to be processed of a single-crystallized or crystallized Ge.

Although specific process conditions are illustrated in the first and second embodiments, the process conditions are not limited thereto. In some embodiments, the process conditions may be varied according to a volume of a processing chamber in which a workpiece is accommodated, or a process pressure of the processing chamber, or the like.

According to the present disclosure, it is possible to provide a film forming method and a film forming apparatus adapted to perform the film forming method, which are capable of suppressing irregularities from being generated on a surface of a crystallized Si film, a crystallized Ge film or a crystallized SiGe film due to a facet or a cross hatch pattern, even when the crystallized Si film, the crystallized Ge film or the crystallized SiGe film is respectively grown on a single-crystallized Si, a single-crystallized Ge or single-crystallized SiGe. In addition, according to the present disclosure, it is possible to provide a film forming method and a film forming apparatus adapted to perform the film forming method, which are capable of depositing an amorphous Si film, an amorphous Ge film or an amorphous SiGe film on a single-crystallized Si, a single-crystallized Ge or a single-crystallized SiGe, respectively.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a film comprising:
preparing a workpiece with a crystallized silicon film or a silicon-germanium film formed on a surface of the workpiece;
accommodating the workpiece into a processing chamber;
supplying a crystallization suppressing process gas into the processing chamber such that a crystallization of a film to be formed on the crystallized silicon film or the silicon-germanium film is suppressed such that a lattice constant is changed on an entire surface of the crystallized silicon film or the silicon-germanium film; and
after supplying a crystallization suppressing process gas, supplying a source gas into the processing chamber to form an amorphous film on the crystallized silicon film or the silicon-germanium film,
wherein the crystallization suppressing process gas is selected from a group consisting of a phosphine-based gas, a borane-based gas, a hydrocarbon-based gas, and an organosilane-based gas.

2. The method of claim 1, further comprising: removing an oxide film from a surface of the crystallized silicon film or the silicon-germanium film before supplying a crystallization suppressing process gas.

3. The method of claim 2, wherein a hydrogen-containing gas is used in removing the oxide film.

4. The method of claim 1, further comprising: crystallizing the amorphous film after supplying a source gas.

5. The method of claim 1, wherein the film to be formed on the crystallized silicon film or the silicon-germanium film includes one of a silicon film, a germanium film and a silicon-germanium film.

6. The method of claim 1, wherein the source gas includes one of silicon, germanium and silicon-germanium.

7. The method of claim 1, wherein the amorphous film includes one of an amorphous silicon film, an amorphous germanium film and an amorphous silicon-germanium film.

8. A method of forming a film on a surface of a crystallized silicon film or a silicon-germanium film, the method comprising:
changing a lattice constant of the entire surface of the crystallized silicon film or the silicon-germanium film; and
after changing a lattice constant, forming an amorphous film on the surface of the crystallized silicon film or the silicon-germanium film,
wherein a phosphine-based gas, a borane-based gas, a hydrocarbon-based gas, or an organosilane-based gas is used in changing a lattice constant.

9. The method of claim 8, further comprising: removing an oxide film from the surface of the crystallized silicon film or the silicon-germanium film before changing a lattice constant.

10. The method of claim 8, further comprising: crystallizing the amorphous film.

11. The method of claim 8, wherein the amorphous film includes one of an amorphous silicon film, an amorphous germanium film and an amorphous silicon-germanium film.

* * * * *